United States Patent
Chen

(10) Patent No.: US 10,510,782 B2
(45) Date of Patent: Dec. 17, 2019

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Yupeng Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/553,442

(22) PCT Filed: Mar. 7, 2017

(86) PCT No.: PCT/CN2017/075876
§ 371 (c)(1),
(2) Date: Aug. 24, 2017

(87) PCT Pub. No.: WO2018/018891
PCT Pub. Date: Feb. 1, 2018

(65) Prior Publication Data
US 2018/0247959 A1     Aug. 30, 2018

(30) Foreign Application Priority Data
Jul. 29, 2016  (CN) .......................... 2016 1 0620200

(51) Int. Cl.
*H01L 27/12*   (2006.01)
*H01L 21/66*   (2006.01)

(52) U.S. Cl.
CPC ...... *H01L 27/1244* (2013.01); *H01L 27/1262* (2013.01); *H01L 27/1288* (2013.01); *H01L 22/22* (2013.01)

(58) Field of Classification Search
CPC . G09G 2330/10; H01L 27/3276; H01L 22/14; H01L 22/22; H01L 21/84;
(Continued)

(56) References Cited

U.S. PATENT DOCUMENTS 5,132,819 A * 7/1992 Noriyama ........... G02F 1/13624
                                                 349/144
5,337,173 A * 8/1994 Atsumi ............. G02F 1/136213
                                                  349/39
(Continued)

FOREIGN PATENT DOCUMENTS

CN    101887897 A    11/2010
CN    102315227 A     1/2012
(Continued)

OTHER PUBLICATIONS

International Search Report and Written Opinion dated Jun. 15, 2017; PCT/CN2017/075876.

*Primary Examiner* — Mary A Wilczewski

(57) ABSTRACT

An array substrate and a manufacturing method thereof and a display device are provided. The manufacturing method includes: forming a first signal line and a second signal line which have a same extension direction and are separated from each other on a base substrate; forming an initial pixel electrode on the base substrate, such that the initial pixel electrode includes a first extension portion, and the initial pixel electrode is connected to the first signal line by the first extension portion and the initial pixel electrode is separated from the second signal line; and removing at least part of the (Continued)

first extension portion of the initial pixel electrode to form the pixel electrode separated from the first signal line.

13 Claims, 11 Drawing Sheets

(58) Field of Classification Search
CPC . H01L 27/12; H01L 27/1244; H01L 27/1262; H01L 27/1288; H01L 27/3248; H01L 51/0023; H01L 51/5212; H01L 51/5228; G02F 1/136259; G02F 2001/136263; G02F 2001/136268; G02F 2001/136272
See application file for complete search history.

(56) References Cited

U.S. PATENT DOCUMENTS

| | | | | |
|---|---|---|---|---|
| 5,691,786 | A * | 11/1997 | Nakai | G02F 1/136213 349/39 |
| 6,822,701 | B1 | 11/2004 | Kasahara et al. | |
| 7,385,576 | B2 * | 6/2008 | Moon | G09G 3/3648 345/100 |
| 7,944,413 | B2 * | 5/2011 | Shibusawa | G09G 3/325 345/204 |
| 7,990,356 | B2 * | 8/2011 | Chung | G09G 3/3648 345/93 |
| 8,860,705 | B2 * | 10/2014 | Shirouzu | G09G 3/006 345/211 |
| 9,460,656 | B2 * | 10/2016 | Shim | G09G 3/3225 |
| 10,276,603 | B2 * | 4/2019 | Wang | H01L 22/22 |
| 2005/0078235 | A1 * | 4/2005 | Ozaki | G02F 1/136259 349/55 |
| 2007/0126460 | A1 * | 6/2007 | Chung | G09G 3/3648 345/98 |
| 2008/0116501 | A1 * | 5/2008 | Lin | G02F 1/136259 257/315 |
| 2009/0152552 | A1 * | 6/2009 | Ku | G02F 1/136213 257/59 |
| 2010/0187538 | A1 * | 7/2010 | Koo | H01L 27/124 257/72 |
| 2013/0215354 | A1 * | 8/2013 | Yoon | G02F 1/1309 349/46 |
| 2013/0240914 | A1 * | 9/2013 | Jin | H01L 27/3246 257/88 |
| 2015/0227011 | A1 * | 8/2015 | Zhang | G02F 1/136259 257/72 |
| 2018/0247959 | A1 * | 8/2018 | Chen | H01L 27/1244 |
| 2018/0294289 | A1 * | 10/2018 | Wang | H01L 22/22 |
| 2018/0348586 | A1 * | 12/2018 | Li | H01L 22/22 |

FOREIGN PATENT DOCUMENTS

| | | | | |
|---|---|---|---|---|
| KR | 2002-054850 | * | 7/2002 | ........ H01L 27/3248 |
| WO | WO 2018/018891 | * | 2/2018 | ............ H01L 21/84 |

* cited by examiner

ARRAY SUBSTRATE AND MANUFACTURING METHOD THEREOF, AND DISPLAY DEVICE

TECHNICAL FIELD

Embodiments of the present disclosure relate to an array substrate and a manufacturing method thereof; and a display device.

BACKGROUND

Liquid crystal display device is a mainstream product in a field of display. One of key components of the liquid crystal display device is an array substrate provided with a plurality of pixel units. For example, a manufacturing process for the array substrate includes forming the following layers on a substrate in sequence: a pixel electrode layer including a pixel electrode, a gate metal layer including a gate line and a common electrode line (also called as a storage capacitance line), a gate insulation layer, an active layer, a data metal layer including a source/drain electrode and a data line, a passivation layer and a common electrode layer including a common electrode.

SUMMARY

According to embodiments of the disclosure, a manufacturing method for an array substrate is provided. The method comprises: forming a first signal line and a second signal line which have a same extension direction and are separated from each other on a base substrate; forming an initial pixel electrode on the base substrate, wherein the initial pixel electrode includes a first extension portion, the initial pixel electrode is connected to the first signal line by the first extension portion, and the initial pixel electrode is separated from the second signal line; and removing at least part of the first extension portion of the initial pixel electrode to form a pixel electrode separated from the first signal line.

For example, the manufacturing method further comprises: forming a common electrode on the base substrate after forming the first signal line, the second signal line and the initial pixel electrode.

For example, the forming the common electrode on the base substrate includes: forming a common electrode film on the base substrate; and performing a patterning treatment on the common electrode film to form the common electrode; in the patterning treatment, the at least part of the first extension portion of the initial pixel electrode is removed.

For example, the manufacturing method further comprises: before forming the common electrode, forming an insulation layer covering the initial pixel electrode on the base substrate and a via hole located in the insulation layer. The via hole at least exposes the at least part of the first extension portion of the initial pixel electrode.

For example, one of the first signal line and the second signal line is a gate line, and the other of the first signal line and the second signal line is a common electrode line.

For example, forming the first signal line and the second signal line includes: forming a conductive film, performing a patterning treatment on the conductive film to form the first signal line and the second signal line.

For example, the manufacturing method further comprises: forming a thin film transistor on the base substrate, the thin film transistor including a gate electrode, a source electrode, a drain electrode and an active layer. The initial pixel electrode further includes a second extension portion, and the second extension portion is connected to the drain electrode.

For example, the manufacturing method further comprises: forming a thin film transistor on the base substrate, the thin film transistor including a gate electrode, a source electrode, a drain electrode and an active layer. The drain electrode of the thin film transistor is connected to the first extension portion of the initial pixel electrode.

For example, the manufacturing method further comprises: before removing the at least part of the first extension portion of the initial pixel electrode, performing defect detection on the first signal line and the second signal line between adjacent initial pixel electrodes.

According to the embodiments of the disclosure, an array substrate is provided. The array substrate comprises: a base substrate; a first signal line and a second signal line disposed on the base substrate, wherein the first signal line and the second signal line have a same extension direction and are separated from each other; and a pixel electrode layer disposed on the base substrate, wherein the pixel electrode layer includes a pixel electrode and a remain portion separated from the pixel electrode, and the remain portion is connected to the first signal line and is separated from the second signal line.

For example, the array substrate further comprises: a common electrode, disposed on a side of the pixel electrode layer away from the base substrate.

For example, the array substrate further comprises: an insulation layer covering the pixel electrode layer. A via hole is disposed in the insulation layer, and at least part of the via hole corresponds to an interval region between the pixel electrode and the remain portion.

For example, the via hole is located outside a region corresponding to the common electrode.

For example, the pixel electrode includes a first protrusion portion, the first protrusion portion is a protrusion protruding toward the first signal line connected to the remain portion, and the via hole is located between the first protrusion portion and the remain portion.

For example, the array substrate further comprises: a thin film transistor disposed on the base substrate, the thin film transistor including a gate electrode, a source electrode, a drain electrode and an active layer. The pixel electrode further includes a second protrusion portion, and the pixel electrode is connected to the drain electrode by the second protrusion portion.

For example, the array substrate further comprises: a thin film transistor disposed on the base substrate, the thin film transistor including a gate electrode, a source electrode, a drain electrode and an active layer. The pixel electrode is connected to the drain electrode by the first protrusion portion.

According to the embodiments of the disclosure, a display device is provided. The display device comprises the array substrate as described above.

BRIEF DESCRIPTION OF TELE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 6b is a partial enlarged view of FIG. 6a;

FIG. 7b is a partial enlarged view of FIG. 7a;

FIGS. 8a to 8f are schematic views of manufacturing steps of the array substrate as shown in FIG. 7a;

FIG. 9b is a sectional schematic view along a B-B line and a C-C line in FIG. 9a;

FIG. 10b is a sectional schematic view along a B-B line and a C-C line in FIG. 10a;

Figure 11:
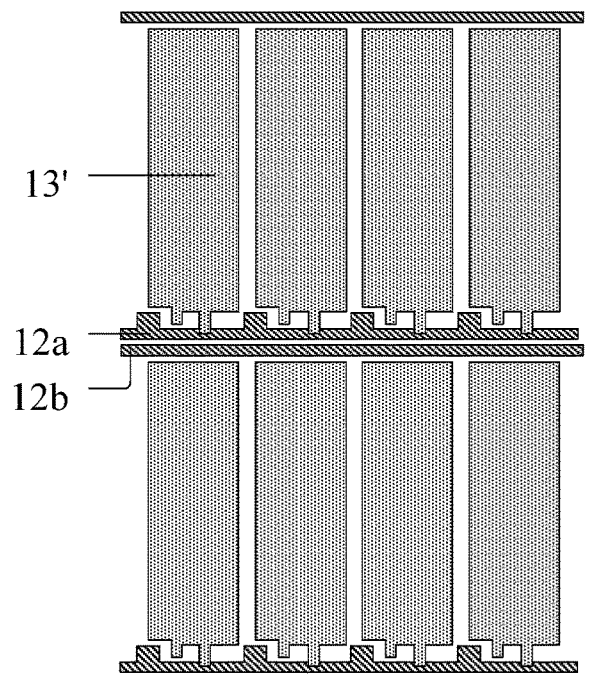
Figure 12:
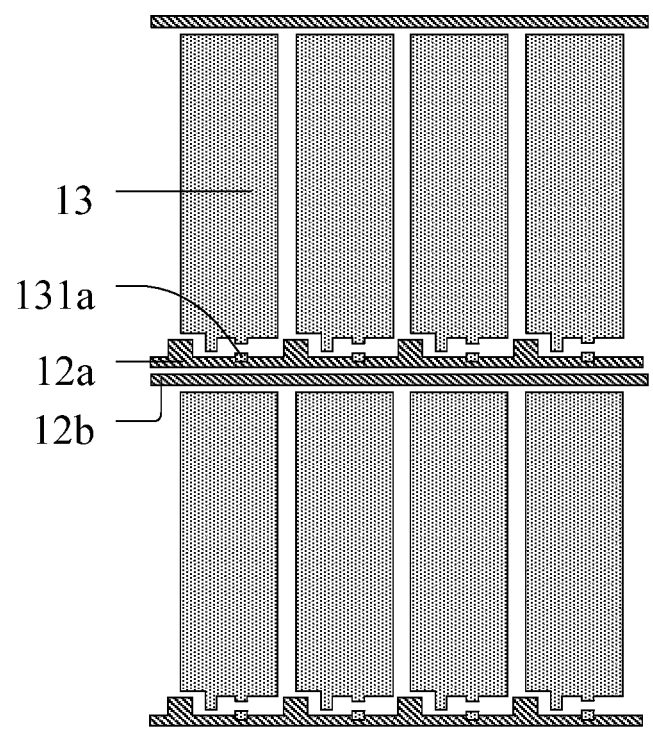

FIG. 11 is a schematic top view of the array substrate manufactured by the method provided by the embodiments of the present disclosure, in which a plurality of pixel structures in periodical distribution are shown; and FIG. 12 is a schematic top view of the array substrate provided by the embodiments of the present disclosure, in which a plurality of pixel structures in periodical distribution are shown.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Thickness and shape of each layer in the drawings do not reflect a true proportion, and merely are intended to explain content of the embodiments of the present disclosure.

Figure 1:
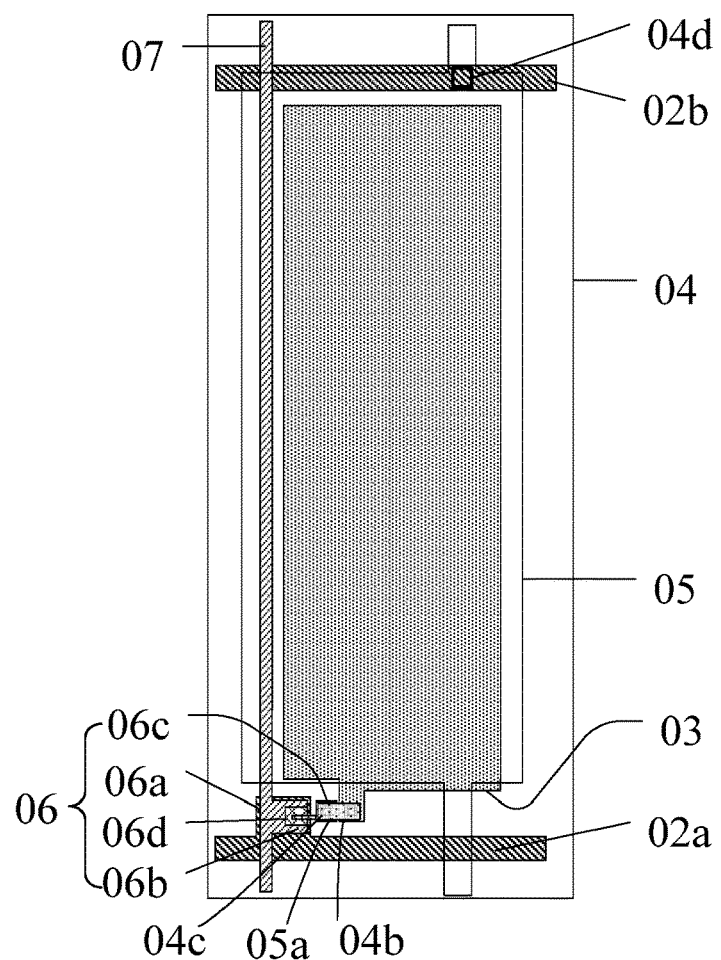
FIG. 1 is a schematic top view of a pixel structure that an array substrate comprises.

FIG. 1 is a schematic view of a pixel structure of an array substrate. For example, a manufacturing method for the pixel structure shown in FIG. 1 comprises steps S01 to S06 below.

Step S01: forming a pixel electrode layer including a pixel electrode 03.

Step S02: forming a gate metal layer including a gate line 02a, a common electrode line 02b and a gate electrode 06a.

Step S03: forming a gate insulation layer covering the gate metal layer.

Step S04: forming an active layer 06d and a data metal layer including a data line 07, a source electrode 06b and a drain electrode 06c on the gate insulation layer. The active layer 06d, the source electrode 06b and the drain electrode 06c formed in this step and the gate electrode 06a formed in the step S02 form a thin film transistor 06.

Step S05: forming a passivation layer covering the active layer 06d and the data metal layer, wherein the passivation layer formed in this step and the gate insulation layer formed in the step S03 are together called as an insulation layer 04; and via holes 04c, 04b and 04d formed in the insulation layer 04 respectively expose a part of the pixel electrode 03, a part of the drain electrode 06c and a part of the common electrode line 02b.

Step S06: forming a common electrode layer including a common electrode 05 and a connection portion 05a on the insulation layer 04, such that the common electrode 05 is connected to the common electrode line 02b by the via hole 04d, the connection portion 05a is connected to the pixel electrode 03 by the via hole 04b and is connected to the drain electrode 06c by the via hole 04c to realize connection between the pixel electrode 03 and the drain electrode 06c.

Figure 2A:
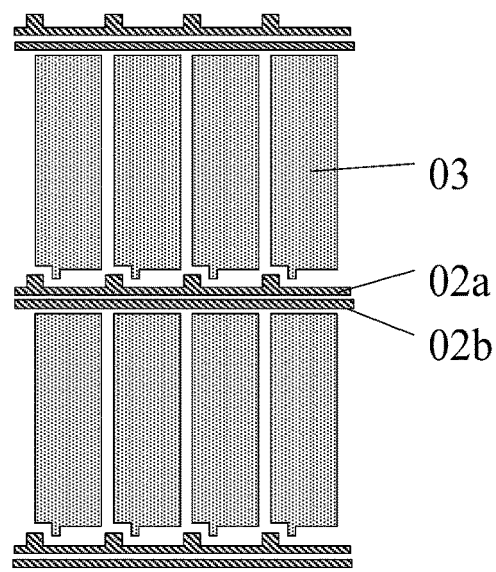
FIG. 2a is a schematic top view of a pixel electrode, a gate line and a common electrode line in the array substrate of FIG. 1.
Figure 2B:
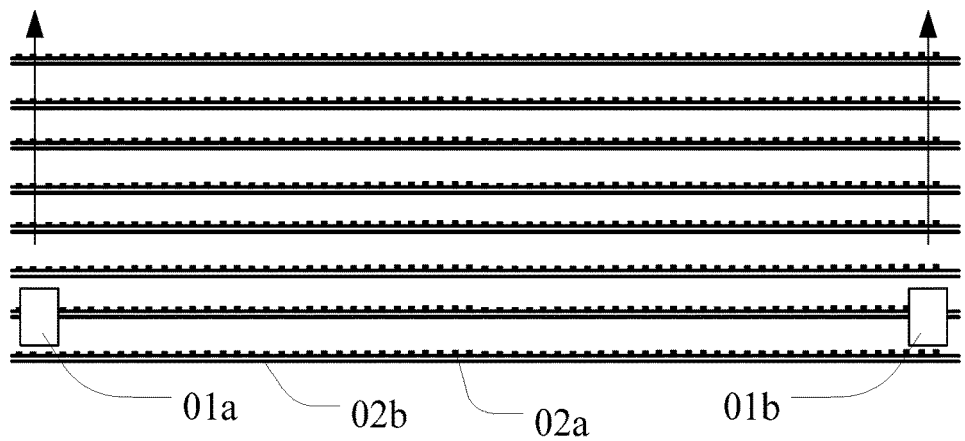
FIG. 2b is a schematic view of a principle for detecting defects between the signal lines.

FIG. 2a is a schematic top view of the array substrate comprising the pixel structure as shown in FIG. 1. As shown in FIG. 2a, the gate line 02a and the common electrode line 02b are alternately disposed and the gate line 02a and common electrode line 02b adjacent to each other are disposed between adjacent pixel electrodes 03, thereby forming a plurality of pixel structures in periodical distribution. In the manufacturing process of the array substrate, after the gate line 02a and the common electrode line 02b are formed, whether short circuit defect occurs between the gate line 02a and the common electrode line 02b needs to be detected. For example, as shown in FIG. 2b, a detection device includes a signal-loading test head and a signal-receiving test head 01b, which are respectively located right above a group of signal lines to be tested (that is, the gate line 02a and the common electrode line 02b adjacent to each other); by loading and receiving the test signal in a capacitance induction manner, whether the short circuit occurs among the group of signal lines is judged, and by moving the test heads (as shown by an arrow in FIG. 2b), whether the respective groups of signal lines have short circuit defect are detected one group by one group.

In research, an inventor of the present application found that: because the gate line and the common electrode line adjacent to each other are very close to each other a difference between a capacitance between the gate line and the test heads of the detection device and a capacitance between the common electrode line and the test heads of the detection device is very small; as a result, in a case that the short circuit occurs between the gate line and the common electrode line adjacent to each other, a resolution capacity of the detection device is insufficient, and the probability that the short circuit defect cannot be detected is larger.

Figure 3:
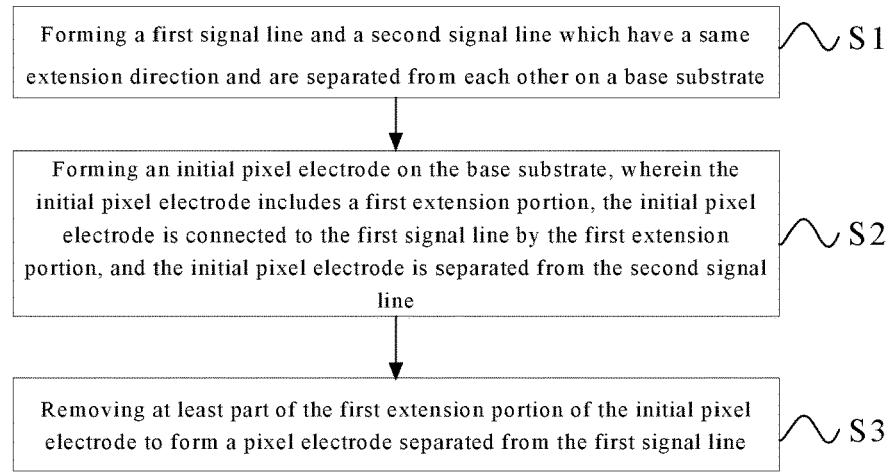
FIG. 3 is a flowchart of a manufacturing method of an array substrate provided by embodiments of the present disclosure.

In order to solve the problem above, as shown in FIG. 3, at least one embodiment of the present disclosure provides a manufacturing method for an array substrate, which comprises steps S1 to S3 below.

Figure 4A:
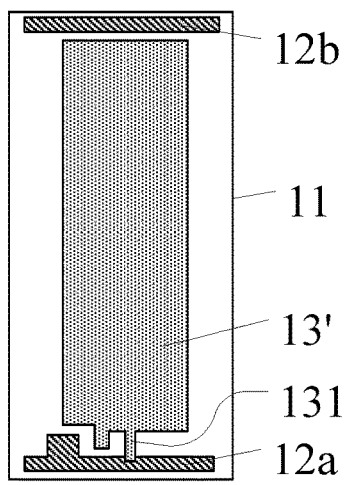
FIG. 4a is a first schematic top view of the array substrate manufactured by the method provided by the embodiments of the present disclosure.
Figure 4B:
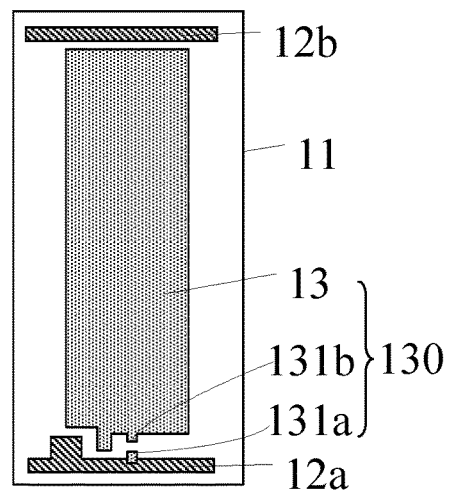
FIG. 4b is a second schematic top view of the array substrate manufactured by the method provided by the embodiments of the present disclosure.

Step S1: as shown in FIG. 4a, forming a first signal line 12a and a second signal line 12b which have an approximately same extension direction and are separated from each other on a base substrate 11;

Step S2: as shown in FIG. 4a, forming an initial pixel electrode 13' on the base substrate 11, wherein the initial pixel electrode 13' includes a first extension portion 131, the initial pixel electrode 13' is connected to the first signal line 12a by the first extension portion 131, and the initial pixel electrode 13' is separated from the second signal line 12b; and Step S3: after the steps S1 and S2 are finished, removing at least part of the first extension portion 131 of the initial pixel electrode 13' to form a pixel electrode 13 separated from the first signal line 12a, as shown in FIG. 4b.

It needs to be noted that a sequence of the steps S1 and S2 is not limited, for example, the step S2 is carried out after the step S1, or the step S1 is carried out after the step S2. In addition, the first extension portion 131 for example is partially removed, for example, after the first extension portion 131 is removed, a pixel electrode layer 130 including the pixel electrode 13 and a remain portion 131a which are separated from each other are formed, and the pixel electrode 13 for example includes a first protrusion portion 131b (as shown in FIG. 4b) or does not include the first protrusion portion 131b. Alternatively, for example, the first extension portion 131 is totally removed.

In the manufacturing process of the array substrate, the pixel structures as shown in FIGS. 4a and 4b are in periodical distribution, and therefore, the first signal line 12a and the second signal line 12b adjacent to each other are disposed between the adjacent initial pixel electrodes 13' (as shown in FIG. 11). By connecting one of the two adjacent signal lines with the initial pixel electrode 13', which is equivalent to the increase of an area of the signal line, in a subsequent process of detecting defects (for example, short circuit defect) between these two signal lines, an obvious difference exists between detection results (for example, capacitance) of the two signal lines detected by a detection device, and thus, a defect detection accuracy is improved; and after the detection is finished, by removing the at least part of the initial pixel electrode 13' to form the pixel electrode 13, functions of the pixel electrode 13 and the signal line are prevented from being affected.

It needs to be explained that an application range of the embodiments of the present disclosure includes, but not limited to, the detection of short circuit defect between the signal lines, and the embodiments of the present disclosure are also used in detection of other types of defects of the signal lines.

For example, the initial pixel electrode 13' is made of a transparent conductive material, for example, transparent metal oxides such as indium tin oxide or indium zinc oxide.

For example, the first and second signal lines are made of a metal material, for example, one or more of aluminum, aluminum neodymium alloy, copper, titanium, molybdenum, molybdenum niobium alloy and the like.

Different signals are applied to the first signal line 12a and the second signal line 12b during the first signal line 12a and the second signal line 12b work, for example, a gate scanning signal is applied to one of the first signal line and the second signal line (that is, one of the first signal line and the second signal line is a gate line), and a common voltage signal is applied to the other of the first signal line and the second signal line (that is, the other of the first signal line and the second signal line is a common electrode line). Of course, in a case that the embodiments of the present disclosure are used for detecting the short circuit defect among other types of signal lines, other types of signals are respectively applied to the first and second signal lines.

For example, in the step S1, the first signal line 12a and the second signal line 12b are formed by patterning a same film to simplify the manufacturing process; for example, a forming process of the first signal line 12a and the second signal line 12b includes: forming a conductive film, performing a patterning treatment on the conductive film to form the first signal line 12a and the second signal line 12b. For example, the patterning treatment includes photoresist coating, photoresist exposing by using a mask, photoresist developing to obtain a photoresist pattern, etching by using the photoresist pattern, and the like. Alternatively, for example, the first and second signal lines are formed by different films respectively and are disposed on the base substrate side by side.

For example, the embodiments of the present disclosure are used for manufacturing the array substrate in a liquid crystal display device or other similar array substrates; and the similar array substrates include the alternately disposed first and second signal lines and the adjacent first and second signal lines are disposed between the adjacent pixel electrodes, such as, an OLED array substrate.

For example, the manufacturing method provided by at least one embodiment of the present disclosure further comprises forming a common electrode. For example, the common electrode 15 is made of a transparent conductive material, for example, a transparent metal oxide such as indium tin oxide or indium zinc oxide.

Figure 5A:
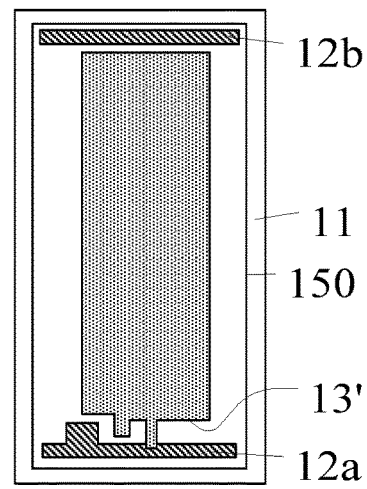
FIG. 5a is a third schematic top view of the array substrate manufactured by the method provided by the embodiments of the present disclosure.

For example, after the first signal line 12a, the second signal line 12b and the initial pixel electrode 13' are formed (after the steps S1 and S2 are finished) and after the detection of the defects (for example, short circuit defect) between the first signal line 12a and the second signal line 12b is finished, the common electrode is formed on the base substrate 11. That is to say, in the array substrate manufactured by the manufacturing method provided by at least one embodiment of the present disclosure, the pixel electrode 13 is disposed between the common electrode and the base substrate 11. For example, forming the common electrode includes: forming a common electrode film 150 on the base substrate 11, as shown in FIG. 5a; and performing patterning treatment on the common electrode film 150 to form a common electrode 15, as shown in FIG. 5b.

It needs to be noted that in a case that the pixel electrode 13 is disposed between the common electrode 15 and the base substrate 11, for example, the common electrode 15 is of a slit structure, and the pixel electrode 13 is of a slit structure or a plate structure. FIG. 5b merely schematically shows the common electrode 15 and the pixel electrode 13, but is not intended to limit the shapes thereof.

Figure 5B:
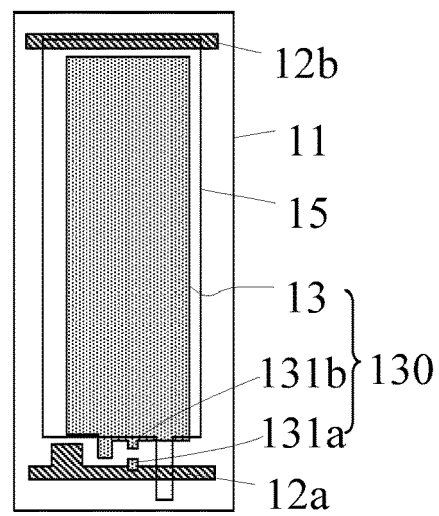
FIG. 5b is a fourth schematic top view of the array substrate manufactured by the method provided by the embodiments of the present disclosure.

For example, in the patterning treatment process of forming the common electrode 15, the at least part of the first extension portion 131 of the initial pixel electrode 13' is removed to form the pixel electrodes 13 as shown in FIG. 5b. The common electrode 15 and the pixel electrode 13 are formed by the same patterning treatment, and the manufacturing process is simplified.

For example, the manufacturing method provided by at least one embodiment of the present disclosure further comprises: before forming the common electrode, forming an insulation layer covering the initial pixel electrode on the base substrate and forming a via hole in the insulation layer, such that the via hole exposes the at least part of the first extension portion of the initial pixel electrode. By disposing the via hole, the at least part of the first extension portion is not covered by the insulation layer, such that a portion of the common electrode film in the via hole and the at least part of the first extension portion exposed by the via hole are removed by a single etching treatment to obtain the pixel electrode.

For example, the manufacturing method provided by at least one embodiment of the present disclosure further comprises: forming a thin film transistor, the thin film transistor including a gate electrode, an active layer, and a source electrode and a drain electrode respectively connected to the active layer, the drain electrode being connected to the initial pixel electrode. For example, a connection manner between the drain electrode and the initial pixel electrode includes the following two manners:

Manner I: on the basis that the initial pixel electrode includes the first extension portion, the initial pixel electrode further includes a second extension portion, and the initial pixel electrode is connected to the drain electrode of the thin film transistor by the second extension portion.

Manner II: the first extension portion that the initial pixel electrode includes is further connected to the drain electrode of the thin film transistor on the basis that the first extension portion is connected to the first signal line.

For example, the thin film transistor adopts a bottom gate structure, that is, the gate electrode is disposed between the active layer and the base substrate; or the thin film transistor adopts a top gate structure, that is, the active layer is disposed between the gate electrode and the base substrate.

The manner I is explained by taking the first signal line which is the gate line, the second signal line which is the common electrode line and the thin film transistor which is the bottom gate structure as examples.

Figure 6A:
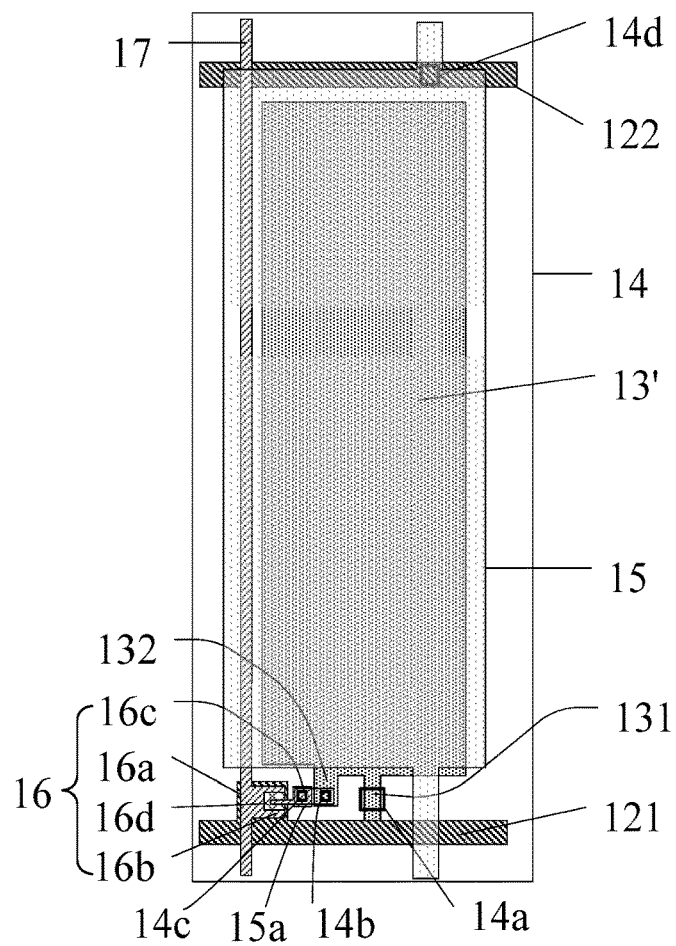
FIG. 6a is a fifth schematic top view of the array substrate manufactured by the method provided by the embodiments of the present disclosure.
Figure 6B:
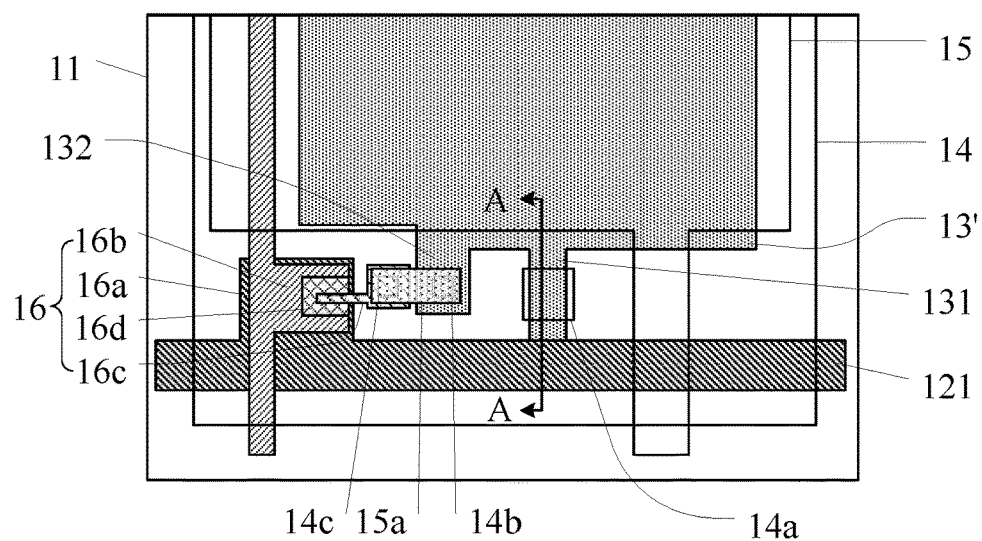

For example, as shown in FIGS. 6a and 6b, before removing the at least part of the first extension portion 131 (that is, before the step S3), the array substrate manufactured by the method provided by any embodiments of the present disclosure includes the gate line 121, the common electrode line 122, a data line 17, the initial pixel electrode 13', the insulation layer 14, the common electrode 15 and the thin film transistor 16. The gate line 121 and the common electrode line 122 extend approximately in a same direction and are separated from each other. The data line 17 is intersected with the gate line 121 and the common electrode line 122. The thin film transistor 16 includes the gate electrode 16a, the source electrode 16b, the drain electrode 16c and the active layer 16d, the gate electrode 16a is connected to the gate line 121, and the source electrode 16b is connected to the data line 17. The initial pixel electrode 13' has the first extension portion 131 and the second extension portion 132; the first extension portion 131 is located outside a region corresponding to the common electrode 15 and is connected to the gate line 121, and the via hole 14a in the insulation layer 14 exposes the at least part of the first extension portion 131; the second extension portion 132 is connected to the drain electrode 16c, for example, the second extension portion 132 is connected to the drain electrode 16c by a connection portion 15a (disposed in the same layer as the common electrode 15) and via holes 14b and 14c in the insulation layer 14. The common electrode 15 is connected to the common electrode line 122 by the via hole 14d in the insulation layer 14.

Figure 6C:
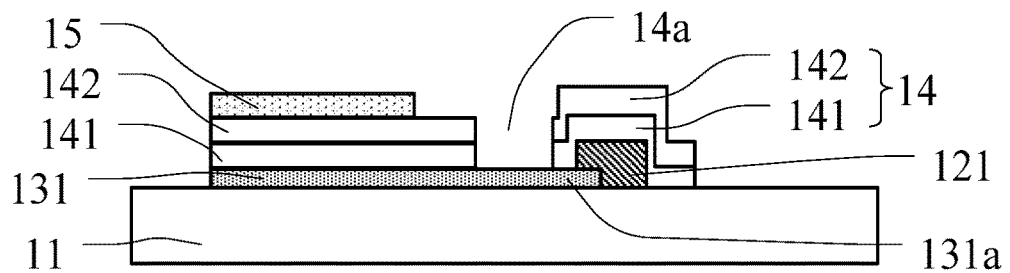
FIG. 6c is a sectional schematic view along an A-A line in FIG. 6b.

For example, as shown in FIG. 6c, the insulation layer 14 includes a first insulation layer 141 and a second insulation layer 142; the first insulation layer 141 is, for example, a gate insulation layer located between the active layer 14d and the gate electrode 14a; and the second insulation layer 142 is, for example, a passivation layer covering the source electrode 14b, the drain electrode 14c and the active layer 14d.

Figure 7A:
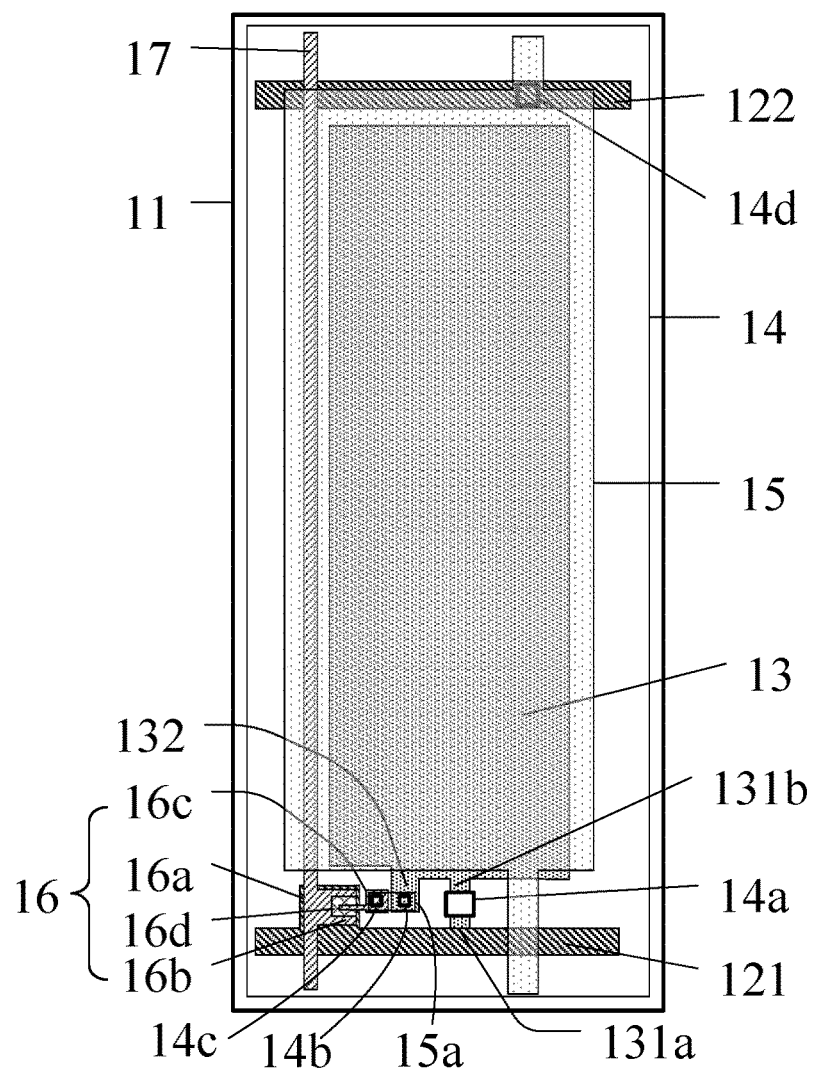
FIG. 7a is a sixth schematic top view of the array substrate manufactured by the method provided by the embodiments of the present disclosure.
Figure 7B:
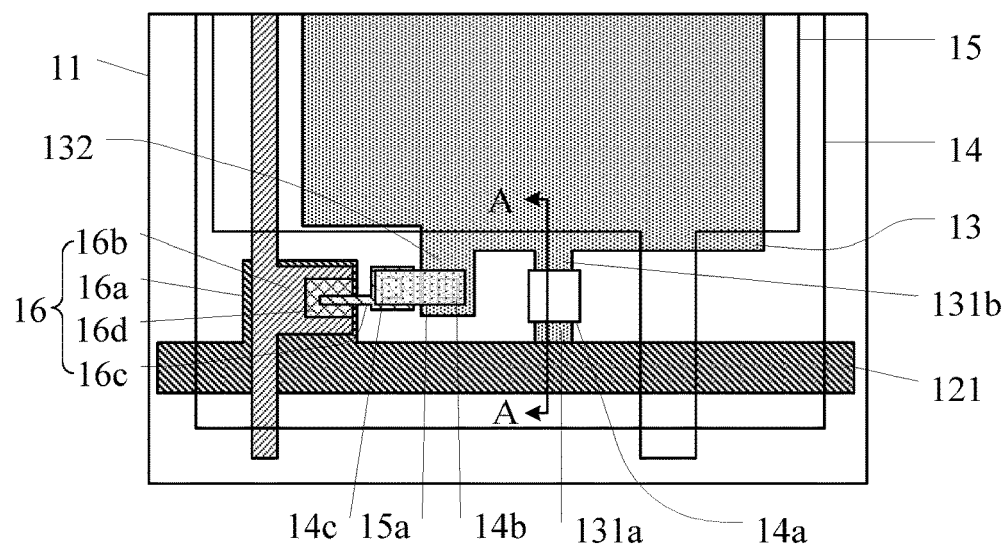
Figure 7C:
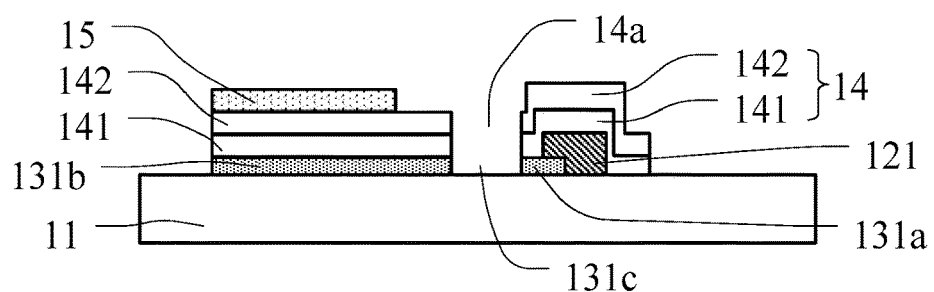
FIG. 7c is a sectional schematic view along an A-A line in FIG. 7b.

For example, as shown in FIGS. 7a to 7b, after the at least part of the first extension portion 131 in the FIGS. 6a to 6c is removed (that is, the step S3 is finished), the pixel electrode 13 has the first protrusion portion 131b and a second protrusion portion 132 (i.e., the second extension portion of the initial pixel electrode); the first protrusion portion 131b and the remain portion 131a of the initial pixel electrode (hereinafter short for "remain portion") are separated; the second protrusion portion 132 is connected to the drain electrode 16c of the thin film transistor 16, for example, is connected to the drain electrode 16c by the connection portion 15a and the via holes 14b and 14c in the insulation layer 14. As shown in FIG. 7c, the via hole 14a penetrating through the insulation layer 14 corresponds to an interval region 131c between the pixel electrode (see the first protrusion portion 131b) and the remain portion 131a.

Regarding the array substrate as shown in FIG. 7a to FIG. 7c, the manufacturing method provided by the embodiments of the present disclosure comprises steps S11 to S16 below.

Figure 8A:
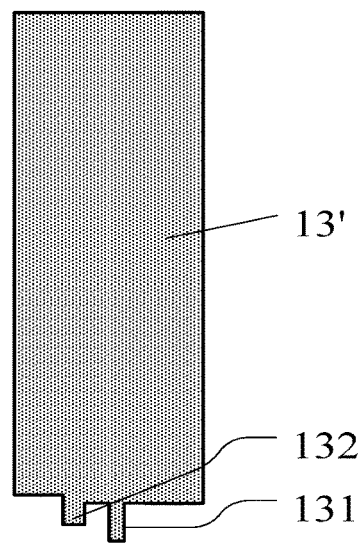

Step S11: as shown in FIG. 8a, forming the initial pixel electrode 13' including the first extension portion 131 and the second extension portion 132.

Figure 8B:
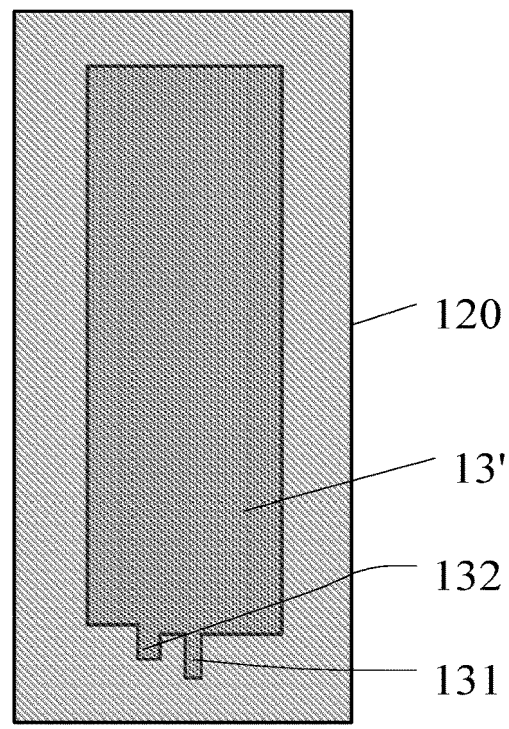
Figure 8C:
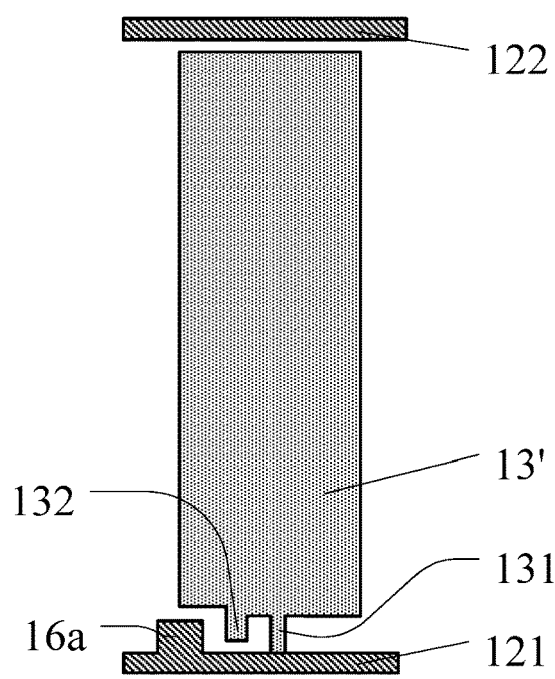

Step S12: as shown in FIG. 8b and FIG. 8c, forming a gate metal film 120, carrying out a patterning treatment to form a gate metal layer including the gate line 121, the common electrode line 122 and the gate electrode 16a.

Figure 8D:
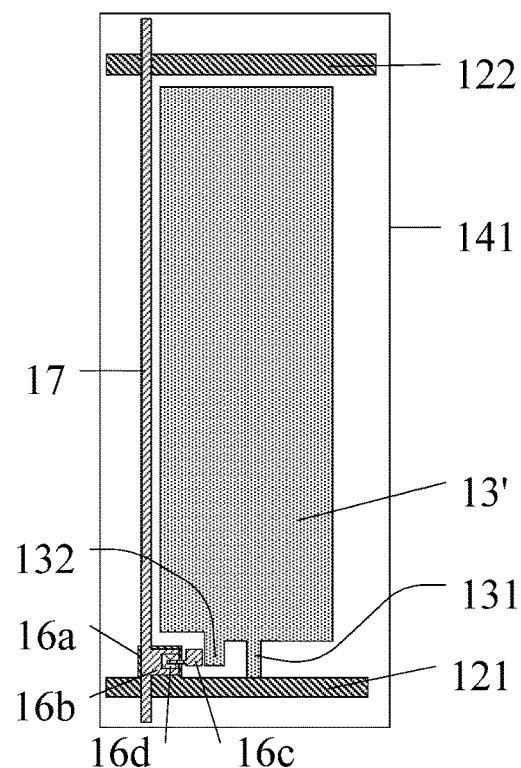

Step S13: as shown in FIG. 8d, forming the first insulation layer 141 covering the gate metal layer.

Step S14: as shown in FIG. 8d, forming the active layer 16d on the first insulation layer 141 and a data metal layer including the data line 17, the source electrode 16b and the drain electrode 16c.

Figure 8E:
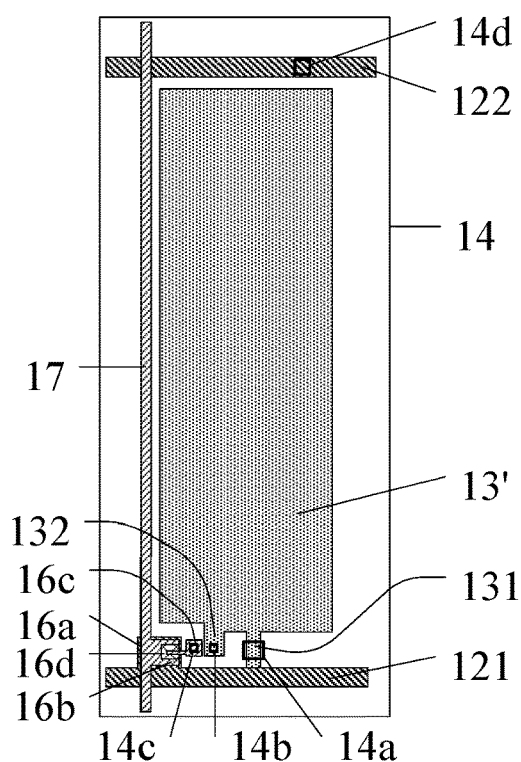

Step S15: as shown in FIG. 8e, forming the second insulation layer (not shown) covering the active layer 16d and the data metal layer, thereby obtaining the insulation layer 14, wherein the via holes 14a, 14b, 14c and 14d formed in the insulation layer 14 respectively correspond to the first extension portion 131, the second extension portion 132, the drain electrode 16c and the common electrode line 122.

Figure 8F:
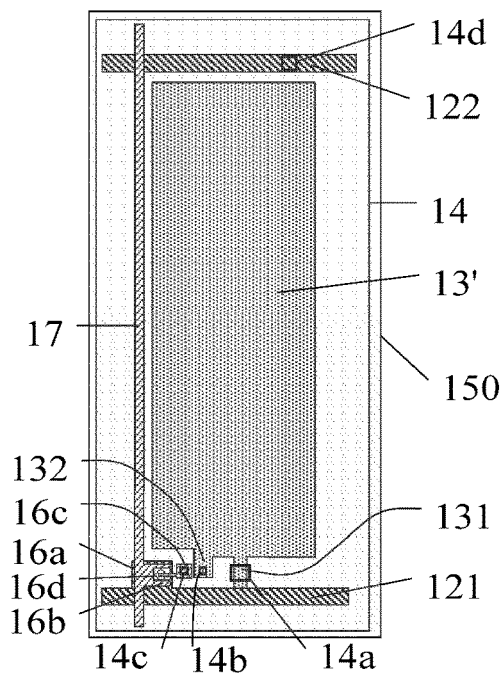

Step S16: as shown in FIG. 8f, forming the common electrode film 150 covering the insulation layer 14; performing a patterning treatment on the common electrode film 150 to form a common electrode layer (as shown in FIGS. 6a to 6c) including the common electrode 15 and the connection portion 15a and a pixel electrode layer (as shown in FIGS. 7a to 7c) including the pixel electrode 13 and the remain portion 131a. The common electrode 15 is connected to the common electrode line 122 by the via hole 14d, the connection portion 15a and the common electrode 15 are separated from each other, and the connection portion 15a is connected with the pixel electrode 13 by the via hole 14b and is connected with the drain electrode 16c by the via hole 14c so that the pixel electrode 13 and the drain electrode 16c are connected together. In such step, the part of the initial pixel electrode 13' (as shown by the first extension portion 131 in FIG. 6c) exposed by the via hole 14a is removed, and therefore, the first protrusion portion 131b of the pixel electrode 13 is separated from the remain portion 131a (as shown in FIG. 7c).

It can be known from the steps S11 to S16 above that compared with the manufacturing method for the array substrate as shown in FIG. 1, the array substrate as shown in FIGS. 7a to 7c only needs to change a mask for forming the pixel electrode 13 and a mask for forming the second insulation layer, therefore, the manufacturing method provided by the embodiments of the present disclosure further has the advantage of simple process on the basis that the accuracy of the detection result of the short circuit defect is improved.

In a case that the first signal line is the common electrode line and the second signal line is the gate line, the manufacturing method provided by at least one embodiment of the present disclosure refers to the steps S11 to S16 above; besides, compared with the manufacturing method for the array substrate as shown in FIG. 1, the manufacturing method needs to change masks for forming the pixel electrode 13 and the second insulation layer and the common electrode.

The above manner II is explained by taking the first signal line which is the gate line, the second signal line which is the common electrode line and the thin film transistor which is of the bottom gate structure as example.

Figure 9A:
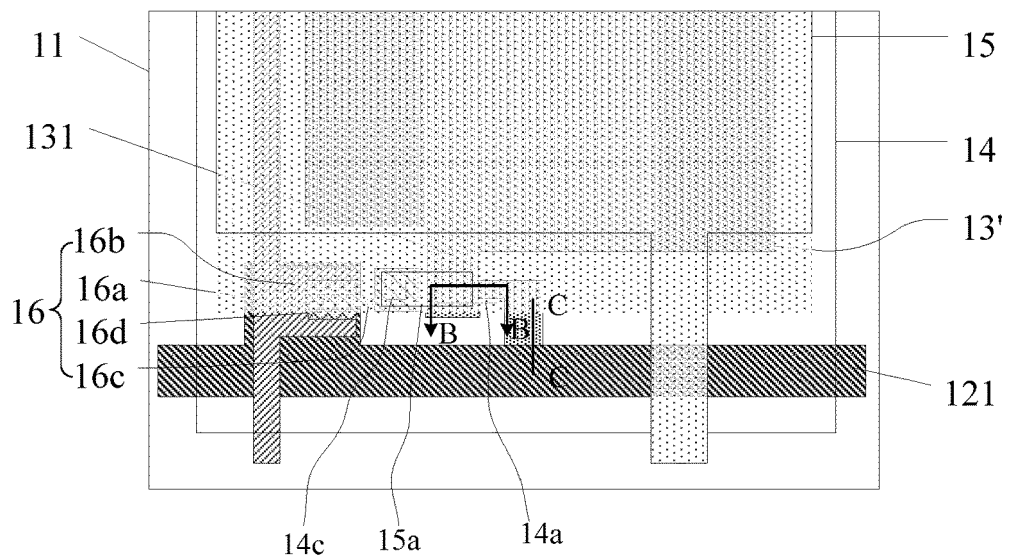
FIG. 9a is a seventh schematic top view of the array substrate manufactured by the method provided by the embodiments of the present disclosure.
Figure 9B:
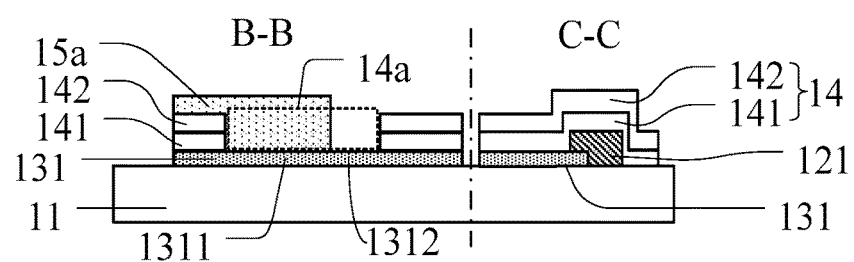

For example, as shown in FIG. 9a, before the at least part of the first extension portion 131 that the initial electrode pixel 13' includes is removed, the connection portion 15a is connected to the first extension portion 131 by the via hole 14a in the insulation layer 14 and is connected to the drain electrode 16c of the thin film transistor 16 by the via hole 14c in the insulation layer 14, and therefore, the electric connection between the first extension portion 131 and the drain electrode 16c is realized. As shown in FIG. 9b, the part of the first extension portion 131 overlapped with the via hole 14a includes a first portion 1311 and a second portion 1312, the first portion 1311 is covered by the connection portion 15a and the second portion 1312 is not covered by the connection portion 15a.

Figure 10A:
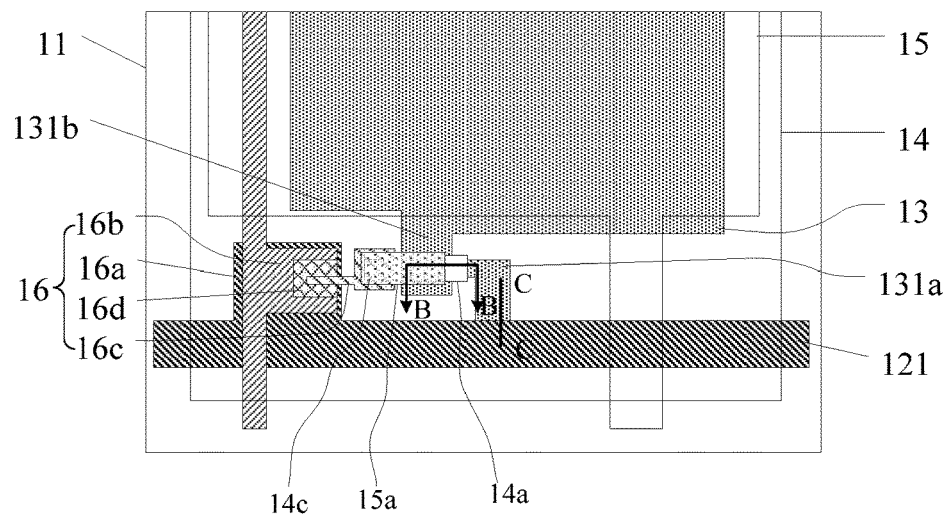
FIG. 10a is an eighth schematic top view of the array substrate manufactured by the method provided by the embodiments of the present disclosure.
Figure 10B:
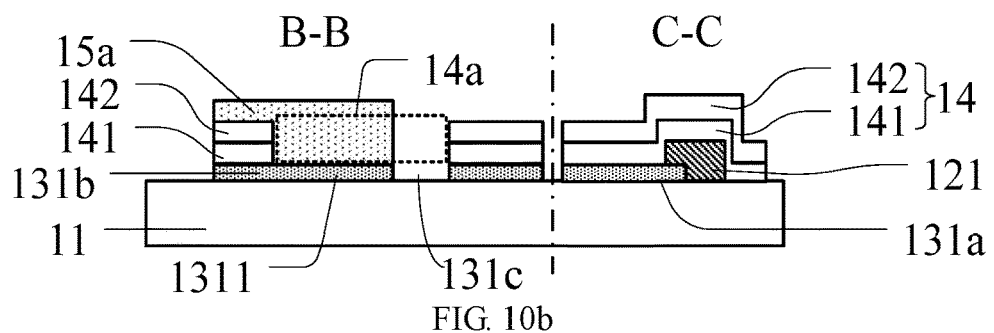

After the at least part of the first extension portion 131 in the FIG. 9a is removed, as shown in FIG. 10a, the first protrusion portion 131b of the pixel electrode 13 is separated from the remain portion 131a and is connected to the drain electrode 16c by the connection portion 15a. As shown in FIG. 10b, the first portion 1311 of the first extension portion 131 is covered by the connection portion 15a and is thus not etched away; the second portion 1312 of the first extension portion 131 is not covered by the connection portion 15a and is thus etched away, therefore, an interval region 131c between the first protrusion portion 131b and the remain portion 131a is formed, and part of the via hole 14a corresponds to the interval region 131c.

With respect to the array substrate as shown in FIGS. 10a and 10b, the manufacturing method provided by the embodiments of the present disclosure further comprise steps S21 to S26 below.

Step S21: as shown in FIG. 9a, forming the initial pixel electrode 13' including the first extension portion 131.

Step S22: forming the gate metal film, performing a patterning treatment to form the gate metal layer including the gate line 121, the common electrode line and the gate electrode 16a, as shown in FIG. 9a.

Step S23: as shown in FIG. 9b, forming the first insulation layer 141 covering the gate metal layer.

Step S24: as shown in FIG. 9a, forming the active layer 16d and the data metal layer including the data line 17, the source electrode 16b and the drain electrode 16c on the first insulation layer (not shown).

Step S25: as shown in FIGS. 9a and 9b, forming the second insulation layer 142 covering the active layer 16d and the data metal layer, thereby obtaining the insulation layer 14; and forming the via hole 14a corresponding to the first extension portion 131, the via hole 14c corresponding to the drain electrode 16c and the via hole 14d corresponding to the common electrode line 122 in the insulation layer 14.

Step S26: forming the common electrode film covering the insulation layer 14, and performing a patterning treatment on the common electrode film to form the common electrode layer including the common electrode 15 and the connection portion 15a (as shown in FIGS. 9a and 9b) and the pixel electrode layer (as shown in FIGS. 10a and 10b) including the pixel electrode 13 and the remain portion 131a, such that the common electrode 15 is connected to the common electrode line by the via hole 14d, the connection portion 15a and the common electrode 15 are separated, and the connection portion 15a is connected with the pixel electrode 13 by the via hole 14a and is connected with the drain electrode 16c by the via hole 14c so that the pixel electrode 13 and the drain electrode 16c are connected together. In such step, the part of the first extension portion 131 of the initial pixel electrode 13' (as shown in FIG. 9a) exposed by the via hole 14a is partially removed, such that the first protrusion portion 131b and the remain portion 131a of the pixel electrode 13 are separated.

It can be known from the steps S21 to S26, compared with the manufacturing method for the array as shown in FIG. 1, the array substrate as shown in FIGS. 10a and 10b only need to change a mask for forming the pixel electrode 13 and a mask for forming the second insulation layer. Therefore, the manufacturing method provided by the embodiments of the present disclosure further has the advantage of simple process on the basis that the accuracy of a detection result of the short circuit defect is improved.

For example, as shown in FIG. 11, the manufacturing method provided by the embodiment of the present disclosure further comprises: forming a plurality of the first signal lines 12a, a plurality of the second signal lines 12b and a plurality of the initial pixel electrodes 13'; the first signal lines 12a and the second signal lines 12b are alternately arranged, and the first signal line 12a and the second signal line 12b which are adjacent to each other are disposed between the adjacent initial pixel electrodes 13'.

For example, the manufacturing method provided by at least one embodiment of the present disclosure further comprises: before removing the at least part of the first extension portion 131 of the initial pixel electrode 13', performing defect detection on the first signal line 12a and the second signal line 12b between the adjacent initial pixel electrodes 13'. For example, the defect detection is defect detection of short circuits between the first signal line 12a and the second signal line 12b. The detection of the short circuit defects can refer to the related description above in combination with FIG. 2b, and repetitions are not repeated.

For example, a same first signal line 12a is connected to a plurality of initial pixel electrodes 13', which is favorable for increasing a difference between the capacitance of the first signal line 12a detected by the detection device and the capacitance of the second signal line 12b detected by the detection device in a short circuit detecting process.

After the short circuit detection is finished, the manufacturing method for the array substrate provided by the embodiments of the present disclosure further comprises the steps of forming the common electrode and the thin film transistor and the like, and these steps can refer to the embodiments about the manufacturing method, and will not be repeated.

At least one embodiment of the present disclosure further provides an array substrate, as shown in FIGS. 4b and 5b, the array substrate comprises: the base substrate 11; and the first signal line 12a and the second signal line 12b disposed on the base substrate 11, wherein the first signal line 12a and the second signal line 12b have the same extension direction and are separated from each other; and the pixel electrode layer 130 disposed on the base substrate 11, wherein the pixel electrode layer 130 includes the pixel electrode 13 and the remain portion 131a separated from the pixel electrode 13, and the remain portion 131a is connected to the first signal line 12a and is separated from the second signal line 12b.

For example, as shown in FIG. 5b, the array substrate provided by at least one embodiment of the present disclosure further comprises the common electrode 15, disposed on one side of the pixel electrode 13 away from the base substrate 11.

For example, as shown in FIGS. 7a to 7c or as shown in FIGS. 10a and 10b, the array substrate provided by at least one embodiment of the present disclosure further comprises the insulation layer 14 covering the pixel electrode layer, and the via hole 14a is disposed in the insulation layer 14; for example, an orthogonal projection of the via hole 14a in the pixel electrode layer and the interval region 131c between the pixel electrode 13 and the remain portion 131a are overlapped (see FIGS. 7a to 7c), or an orthogonal projection of part of the via hole 14a in the pixel electrode layer and the interval region 131c between the pixel electrode 13 and the remain portion 131a are overlapped (see FIGS. 10a and 10b).

For example, the via hole 14a is located outside a region corresponding to the common electrode 15. In this way, the common electrode and the pixel electrode are formed by a same etching treatment.

For example, as shown in FIG. 4b and FIG. 5b, the pixel electrode 13 includes the first protrusion portion 131b, and the first protrusion portion 131b is a protrusion protruding toward the first signal line 12a connected to the remain portion 131a. For example, as shown in FIGS. 7a to 7c or as shown in FIGS. 10a and 10b, the via hole 14a is located between the first protrusion portion 131b and the remain portion 131a.

For example, the array substrate provided by at least one embodiment of the present disclosure further comprises the thin film transistor 16 disposed on the base substrate 11, and the thin film transistor 16 includes the gate electrode 16a, the source electrode 16b, the drain electrode 16c and the active layer 16d.

For example, in a case of adopting the manner I in the manufacturing method for the array substrate, as shown in FIGS. 7a to 7c, the pixel electrode 13 further includes a second protrusion portion 132; the pixel electrode 13 is connected to the drain electrode 16c of the thin film transistor 16 by the second protrusion portion 132, in other words, the second protrusion portion 132 of the pixel electrode 13 is connected to the drain electrode 16c of the thin film transistor 16.

For example, in a case of adopting the manner II in the manufacturing method for the array substrate, as shown in FIGS. 10a and 10b, the pixel electrode 13 is connected to the drain electrode 16c of the thin film transistor 16 by the first protrusion portion 131b that the pixel electrode 13 includes, in other words, the first protrusion portion 131b of the pixel electrode 13 is connected to the drain electrode 16c of the thin film transistor 16.

For example, as shown in FIG. 12, the array substrate provided by the embodiment of the present disclosure comprises a plurality of the first signal lines 12a, a plurality of the second signal lines 12b, a plurality of the pixel electrodes 13 and a plurality of the remain portions 131a, the first signal lines 12a and the second signal lines 12b are alternately arranged, and the first signal line 12a and the second signal line 12b which are adjacent are arranged between the adjacent pixel electrodes 13.

For example, a same first signal line 12a is connected to a plurality of remain portions 131a. In this way, in the manufacturing process, the first signal line 12a are connected to a plurality of initial pixel electrodes, and therefore it is favorable for increasing a difference between the capacitance of the first signal line 12a detected by the detection device and the capacitance of the second signal line 12b detected by the detection device in a short circuit detecting process.

At least one embodiment of the present disclosure further provides a display device, comprising the array substrate above.

For example, the display device is a liquid crystal panel, an OLED panel, an electronic paper, a cellphone, a tablet computer, a television, a display, a laptop, a digital photo frame, a navigator and any product or part having a display function.

According to the embodiments of the present disclosure, by designing the temporary initial pixel electrode, one of a group of signal lines is connected to the initial pixel electrode, which is equivalent to the increase of the area of the signal line, such that an obvious difference exists between detection results (for example, capacitances) of the two signal lines detected by the detection device, and further the detection accuracy of the defects (for example short circuit defect) between the two signal lines is improved; and after detection is finished, by removing part of the initial pixel electrode to form the pixel electrode, the functions of the pixel electrode and the signal line are prevented from being affected.

In addition, a common function of the via hole in the insulation layer is to realize connection among different parts. However, in at least one embodiment of the present disclosure, the via hole in the insulation layer is used for removing part of the initial pixel electrode to form the pixel electrode. Therefore, the embodiments of the present disclosure expand an application mode of the via hole.

The embodiments of the array substrate and the manufacturing method thereof and the embodiments of the display device mentioned above are mutually referable. In case of no conflict, the embodiments of the present disclosure and the features in the embodiments can be inter-combined.

The foregoing embodiments merely are exemplary embodiments of the disclosure, and not intended to define the scope of the disclosure, and the scope of the disclosure is determined by the appended claims.

The application claims priority of Chinese Patent Application No. 201610620200.6 filed on Jul. 29, 2016, the disclosure of which is incorporated herein by reference in its entirety as part of the present application.

The invention claimed is:

1. A manufacturing method for an array substrate, comprising:
    forming a first signal line and a second signal line which have a same extension direction and are separated from each other on a base substrate;
    forming an initial pixel electrode on the base substrate, wherein the initial pixel electrode includes a first extension portion, the initial pixel electrode is connected to the first signal line by the first extension portion, and the initial pixel electrode is separated from the second signal line; and
    removing at least part of the first extension portion of the initial pixel electrode to form a pixel electrode separated from the first signal line,
    wherein
    the method further comprises: forming a common electrode on the base substrate after forming the first signal line, the second signal line and the initial pixel electrode;
    the forming the common electrode on the base substrate includes: forming a common electrode film on the base substrate; and performing a patterning treatment on the common electrode film to form the common electrode; and
    in the patterning treatment, the at least part of the first extension portion of the initial pixel electrode is removed.

2. A manufacturing method according to claim 1, further comprising:
    forming a data line intersecting with the first signal line and the second signal line on the base substrate,
    wherein the pixel electrode is electrically connected with the data line.

3. The manufacturing method according to claim 1, further comprising:
    before forming the common electrode, forming an insulation layer covering the initial pixel electrode on the base substrate and a via hole located in the insulation layer,
    wherein the via hole at least exposes the at least part of the first extension portion of the initial pixel electrode.

4. The manufacturing method according to claim 3, wherein the via hole is located outside a region corresponding to the common electrode.

5. The manufacturing method according to claim 1, wherein one of the first signal line and the second signal line is a gate line, and the other of the first signal line and the second signal line is a common electrode line.

6. The manufacturing method according to claim 5, wherein forming the first signal line and the second signal line includes: forming a conductive film, performing a patterning treatment on the conductive film to form the first signal line and the second signal line.

7. The manufacturing method according to claim 1, further comprising:
    forming a thin film transistor on the base substrate, the thin film transistor including a gate electrode, a source electrode, a drain electrode and an active layer,
    wherein the initial pixel electrode further includes a second extension portion, and the second extension portion is connected to the drain electrode.

8. The manufacturing method according to claim 1, further comprising:
    forming a thin film transistor on the base substrate, the thin film transistor including a gate electrode, a source electrode, a drain electrode and an active layer,
    wherein the drain electrode of the thin film transistor is connected to the first extension portion of the initial pixel electrode.

9. The manufacturing method according to claim 1, further comprising:
    before removing the at least part of the first extension portion of the initial pixel electrode, performing defect detection on the first signal line and the second signal line between adjacent initial pixel electrodes.

10. The manufacturing method according to claim 1, wherein
    during removing at least part of the first extension portion of the initial pixel electrode to form the pixel electrode separated from the first signal line and electrically connected with the data line, the method further includes: forming a remain portion separated from the pixel electrode, and
    the remain portion is connected to the first signal line and is separated from the second signal line, and the remain portion is a part of the first extension portion of the initial pixel electrode.

11. The manufacturing method according to claim 1, wherein the pixel electrode includes a first protrusion portion, the first protrusion portion is a protrusion protruding toward the first signal line and the first protrusion portion is a part of the first extension portion of the initial pixel electrode.

12. The manufacturing method according to claim 1, wherein the initial pixel electrode and the pixel electrode are not provided between the first signal line and the second signal line immediately adjacent to each other.

13. The manufacturing method according to claim 1, wherein the initial pixel electrode and the first extension portion are provided in a same layer and comprise a same material.

* * * * *